United States Patent
Hau-Riege et al.

(10) Patent No.: US 6,867,056 B1
(45) Date of Patent: Mar. 15, 2005

(54) SYSTEM AND METHOD FOR CURRENT-ENHANCED STRESS-MIGRATION TESTING OF INTERCONNECT

(75) Inventors: Christine Hau-Riege, Fremont, CA (US); Amit P. Marathe, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 155 days.

(21) Appl. No.: 10/283,569

(22) Filed: Oct. 30, 2002

(51) Int. Cl.[7] .............................................. H01L 21/66
(52) U.S. Cl. ...................... 438/17; 324/71.1; 438/14; 438/468
(58) Field of Search ............................... 257/734, 758, 257/767, 773–776, 920; 324/71.1, 71.5, 158.1, 537, 538, 765; 438/14, 17, 18, 468

(56) References Cited

U.S. PATENT DOCUMENTS 5,712,510 A * 1/1998 Bui et al. .................... 257/758
5,900,735 A * 5/1999 Yamamoto .................. 324/537
6,320,391 B1 * 11/2001 Bui ............................. 324/537

OTHER PUBLICATIONS

E.T. Ogawa et al., *Stress–Induced Voiding under Vias Connected to Wide Cu Metal Leads,* IEEE International Reliability Physics Symposium, 2002.

* cited by examiner

*Primary Examiner*—Asok Kumar Sarkar
(74) *Attorney, Agent, or Firm*—Monica H. Choi

(57) ABSTRACT

For testing for stress-migration failure of interconnect, an interconnect test structure is formed with a first feeder line coupled to a test line by a first no-flux structure, and with a second feeder line coupled to the test line by a second no-flux structure. A respective width of each of the first and second feeder lines is greater than a width of the test line. A resistance meter and a timer measure a stress-migration life-time of the interconnect test structure with a current being continuously conducted through the interconnect test structure that is continuously heated to a predetermined temperature.

16 Claims, 12 Drawing Sheets

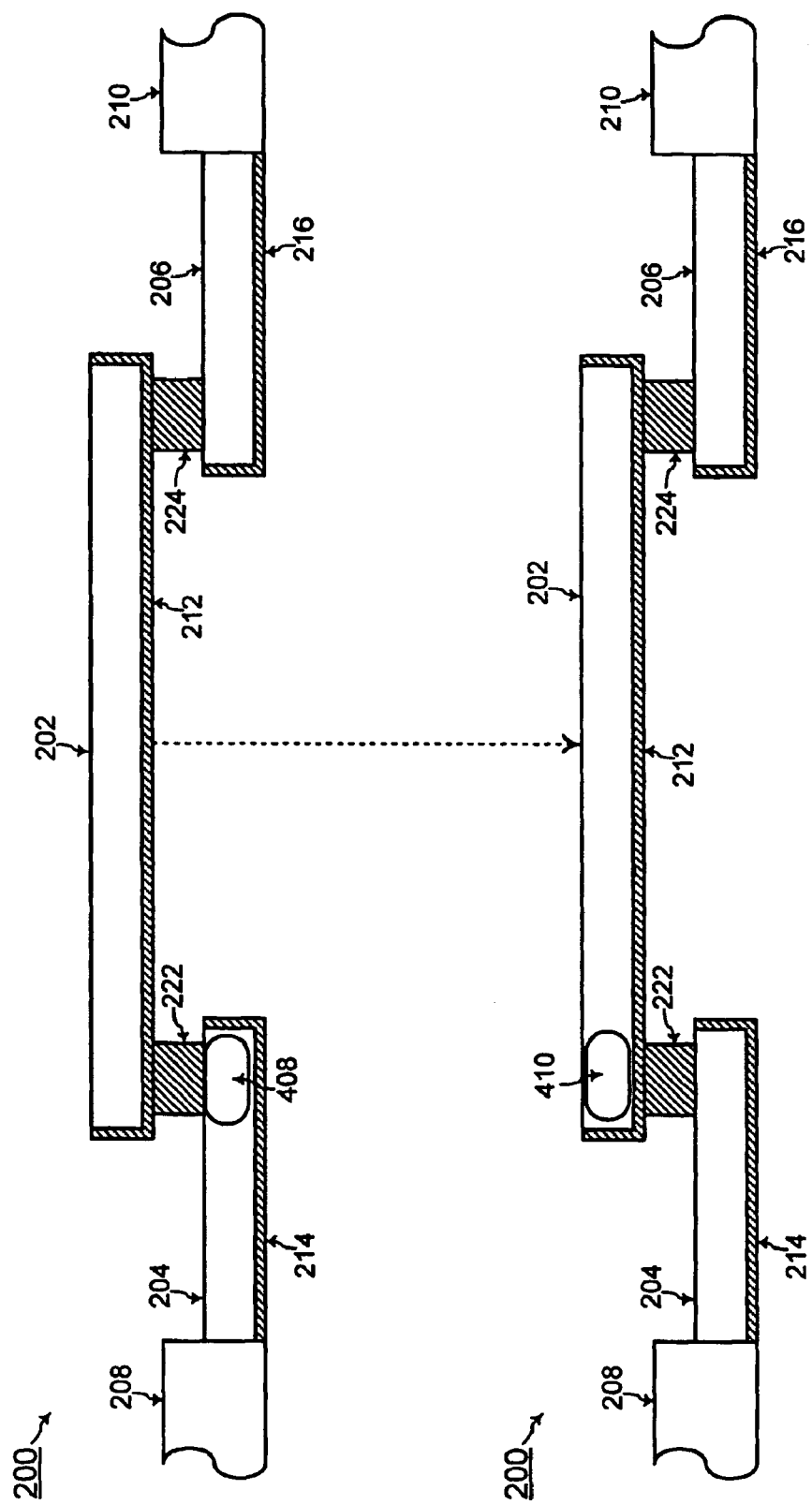

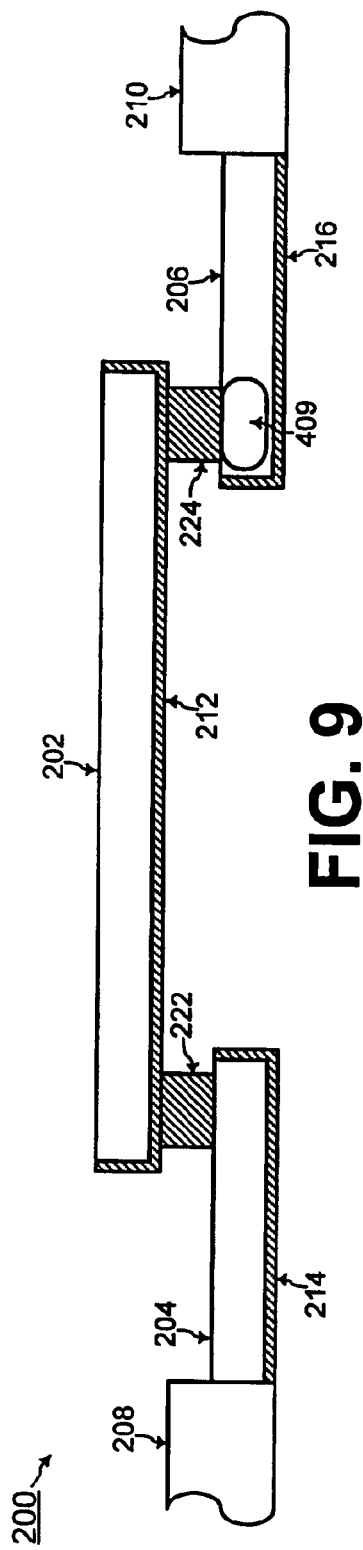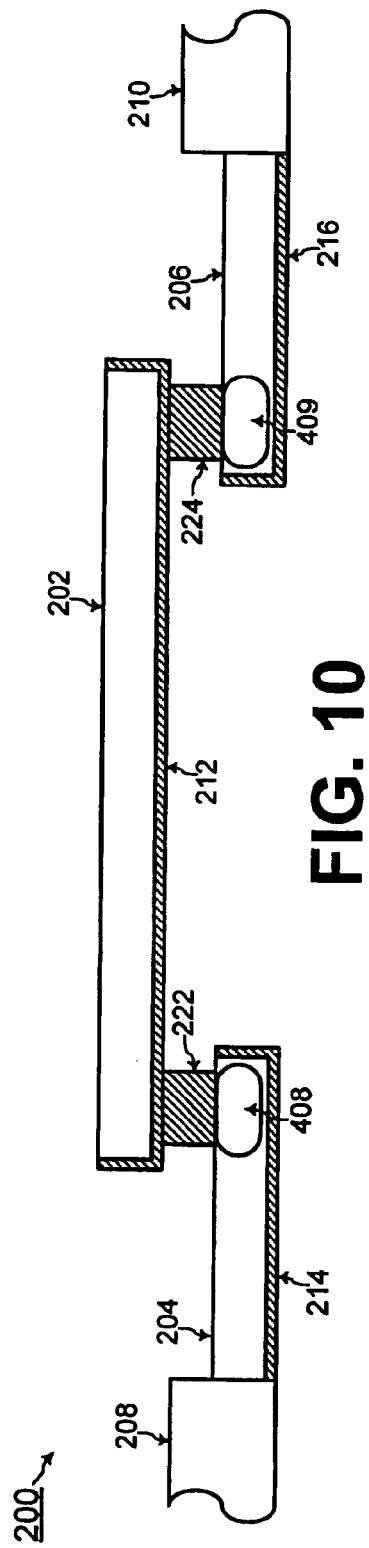

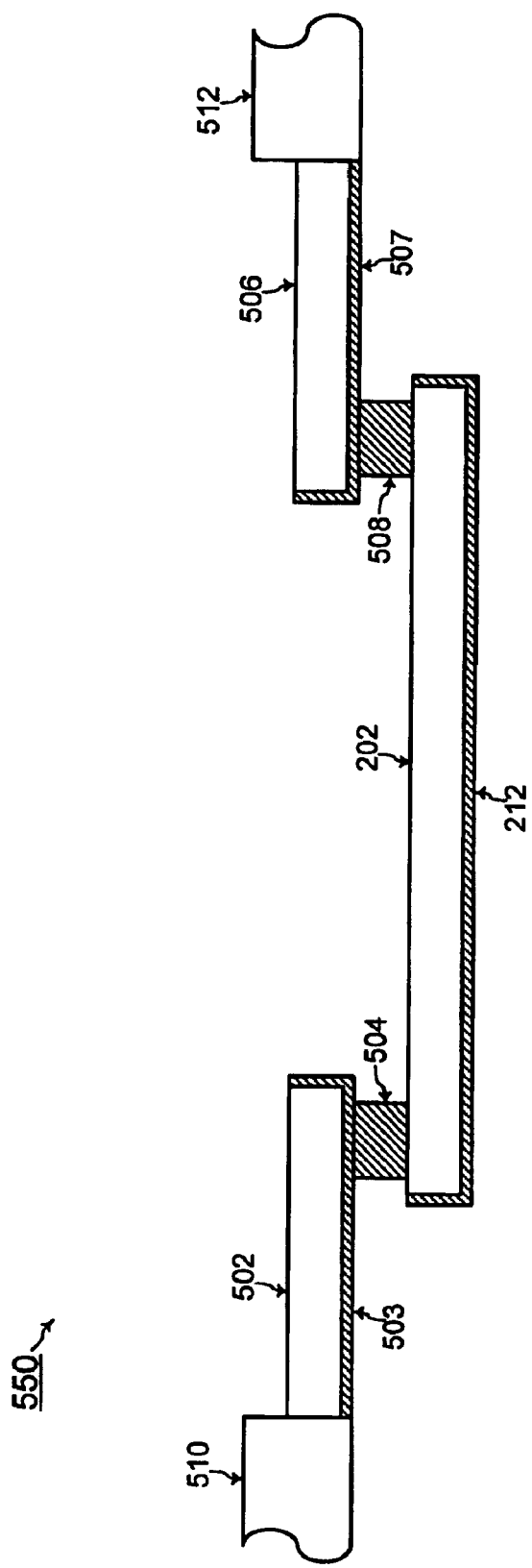

SYSTEM AND METHOD FOR CURRENT-ENHANCED STRESS-MIGRATION TESTING OF INTERCONNECT

TECHNICAL FIELD

The present invention relates generally to interconnect technology in integrated circuit fabrication, and more particularly, to a system and method of testing for stress-migration failure of interconnect with current continuously conducted through the interconnect for accelerated testing.

BACKGROUND OF THE INVENTION

Referring to FIG. 1, a system 100 of the prior art for testing interconnect for stress-migration failure includes a heating chamber 102 with a temperature controller 104. The interconnect structure includes a test line 106 and a feeder line 108. The test line 106 is coupled to the feeder line 108 by a via structure 110 that is part of the dual damascene structure of the test line 106. The temperature controller 104 is used for controlling the temperature within the heating chamber 102, and such a heating chamber is known to one of ordinary skill in the art of integrated circuit fabrication.

When the interconnect structure including the test line 106, the feeder line 108, and the via structure 110 is heated to a range of from about 150° Celsius. to about 350° Celsius. for example, a void 112 forms within the feeder line 108 below the bottom of the via structure 110 from mechanical stress at the interface between the feeder line 108 and the bottom of the via structure 110, as known to one of ordinary skill in the art of integrated circuit fabrication. The test line 106 is coupled to a first test pad 114, and the feeder line 108 is coupled to a second test pad 116. The test line 106, the feeder line 108, the via structure 110, and the first and second test pads 114 and 116 are typically fabricated on a semiconductor wafer that is placed within the heating chamber 102 (and that is not shown in FIG. 1 for clarity of illustration).

Further referring to FIG. 1, a resistance meter 118 is coupled between the first and second test pads 114 and 116 for measuring a resistance across the test line 106, the feeder line 108, and the via structure 110 between the first and second test pads 114 and 116. Such a resistance meter is individually known to one of ordinary skill in the art of electronics. Formation of the void 112 within the feeder line 108 below the bottom of the via structure 110 from stress-migration causes an increase in the resistance measured by the resistance meter 118.

As the interconnect structure having the test line 106, the feeder line 108, and the via structure 110 is heated within the heating chamber 102, a stress-migration life-time is determined when the resistance measured by the resistance meter 118 reaches a threshold resistance level, as known to one of ordinary skill in the art of integrated circuit fabrication. During such stress-migration testing, the interconnect structure having the test line 106, the feeder line 108, and the via structure 110 is continuously heated within the heating chamber 102, and a periodic resistance measurement is made by the resistance meter 118.

In the prior art, no current is continuously conducted through the interconnect structure having the test line 106, the feeder line 108, and the via structure 110 as such an interconnect structure is continuously heated within the heating chamber 102. A relatively small level of current may be conducted through the feeder line 108, the via structure 110, and the test line 106 during the periodic resistance measurements by the resistance meter 118. Such a prior art stress-migration testing system and method may require a burdensome long period of time before the interconnect structure having the test line 106, the feeder line 108, and the via structure 110 exhibits stress-migration failure, such as more than one thousand hours for example.

Nevertheless, during characterization of an integrated circuit fabrication process, the stress-migration life-time of interconnect structures is desired to be determined. Thus, a mechanism is desired for testing for the stress-migration life-time of interconnect structures in less amount of time.

SUMMARY OF THE INVENTION

Accordingly, in a general aspect of the present invention, a system and method of testing for stress-migration failure of interconnect reduces the time to stress-migration failure of an interconnect test structure by continuously conducting a critical current level through the interconnect test structure that is continuously heated.

In one embodiment of the present invention, in a system and method of testing for stress-migration failure of interconnect, a plurality of interconnect test structures are formed, and each interconnect test structure includes a test line having a predetermined length and a predetermined cross-sectional area. In addition, each interconnect test structure includes a first feeder line disposed toward a first end of the test line and being coupled to the test line by a first no-flux structure, and includes a second feeder line disposed toward a second end of the test line and being coupled to the test line by a second no-flux structure. A respective width of each of the first and second feeder lines is greater than a width of the test line.

Furthermore, a heating chamber heats an interconnect test structure to a predetermined temperature, and a current source is used for conducting current through the interconnect test structure as the interconnect test structure is continuously heated within the heating chamber. A resistance meter detects migration failure of the interconnect test structure as current is continuously conducted through the interconnect test structure while the interconnect test structure is continuously heated to the predetermined temperature within the heating chamber. A critical current level is determined when void formation leading to migration failure transitions from occurring within at least one of the first and second feeder lines to occurring within the test line when a current level greater than the critical current level is continuously conducted through an interconnect test structure. A timer measures a stress-migration life-time of an interconnect test structure with the critical current level being continuously conducted through the interconnect test structure that is continuously heated to the predetermined temperature.

In this manner, with the critical current level constantly flowing through the interconnect test structure that is continuously heated, the interconnect test structure exhibits a shorter stress-migration life-time. A higher current level flowing through the interconnect test structure increases the rate of stress-migration failure of the interconnect test structure. The critical current level is the maximum possible current level flowing through the interconnect test structure before electromigration failure instead of stress-migration failure is exhibited by the interconnect test structure. Thus, the critical current level flowing through the interconnect test structure increases the rate of stress-migration failure of the interconnect test structure as much as possible for stress-migration detection.

These and other features and advantages of the present invention will be better understood by considering the following detailed description of the invention which is presented with the attached drawings.

BRIEF DESCRIPTION OF THE DRAWINGS

FIG. 8 shows a cross-sectional view of the interconnect test structure of FIG. 2 when void formation leading to migration failure transitions from occurring within at least one feeder line to occurring within the test line, according to an embodiment of the present invention;

FIG. 9 shows a cross-sectional view of the interconnect test structure of FIG. 2 when void formation leading to migration failure occurs in the other feeder line from FIG. 8, according to an embodiment of the present invention;

FIG. 10 shows a cross-sectional view of the interconnect test structure of FIG. 2 when void formation leading to migration failure occurs within both feeder lines, according to an embodiment of the present invention;

FIG. 13 shows a cross-sectional view of the interconnect test structure of FIG. 2 but with feeder lines and no-flux via structures formed at a higher interconnect level from the test line, according to an embodiment of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 1:
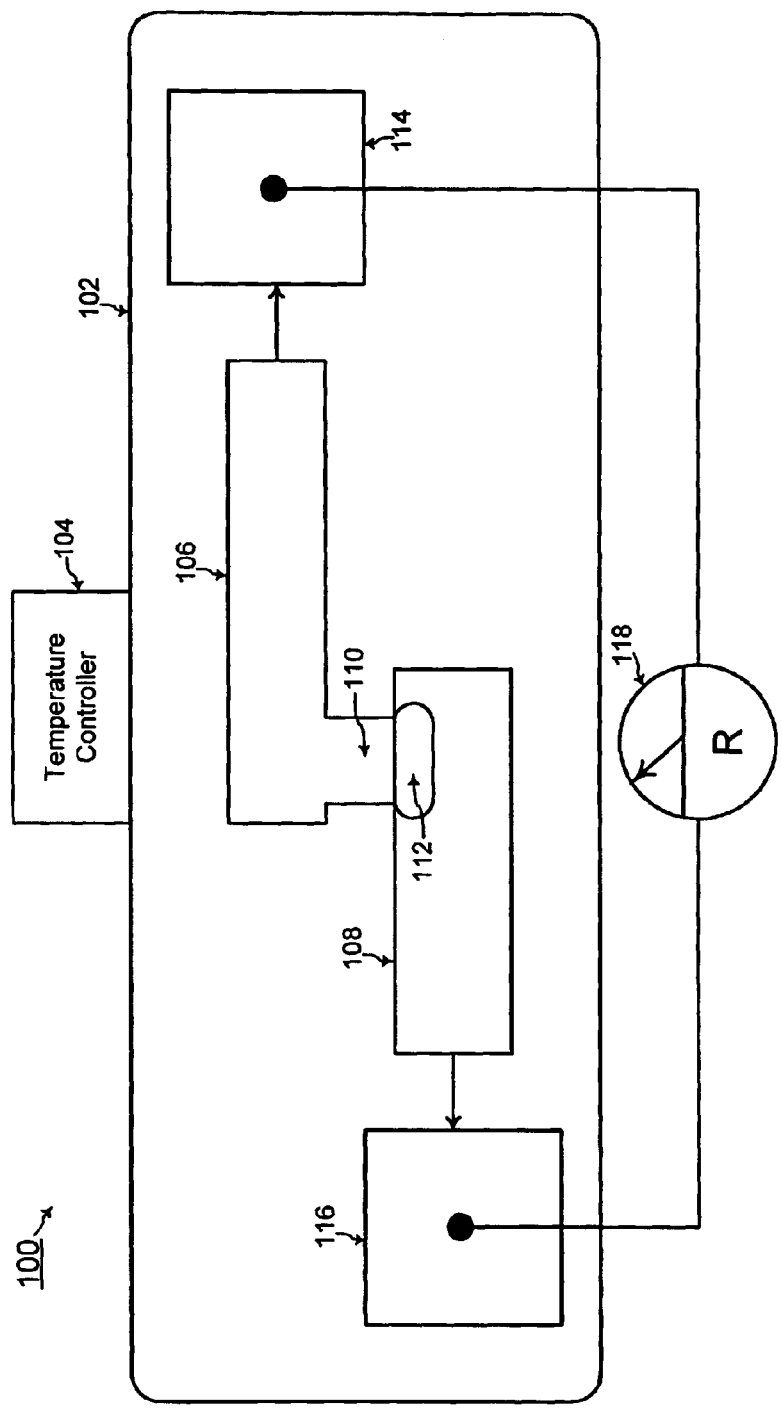
FIG. 1 shows a prior art system for characterizing the stress-migration life-time of an interconnect structure with a burdensome long stress-migration life-time, according to the prior art.
Figure 2:
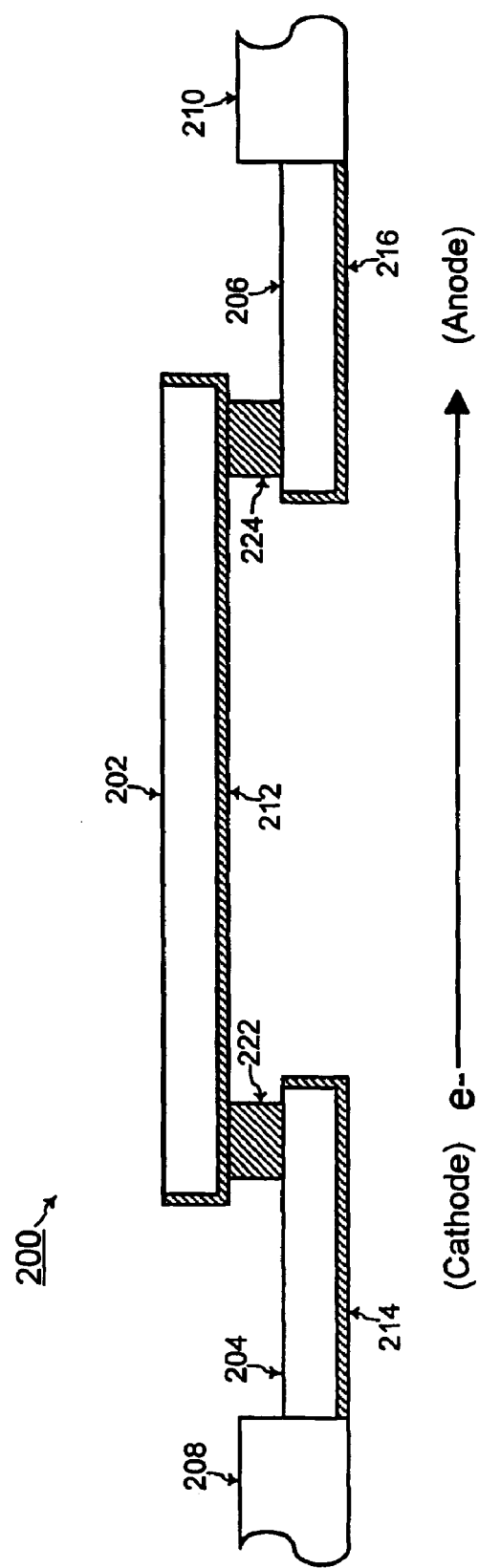
FIG. 2 shows a cross-sectional view of an interconnect test structure having no-flux via structures comprised of tungsten, according to an embodiment of the present invention.

FIG. 2 shows an interconnect test structure 200 including a test line 202, a first feeder line 204, and a second feeder line 206, according to an embodiment of the present invention. The test line 202, the first feeder line 204, and the second feeder line 206 are comprised of copper in one embodiment of the present invention. In that case, the test line 202, the first feeder line 204, and the second feeder line 206 are each surrounded by a respective diffusion barrier layer material 212, 214, and 216. The first feeder line 204 is coupled to a first test pad 208, and the second feeder line 206 is coupled to a second test pad 210.

The test line 202 is coupled to the first feeder line 204 by a first no-flux via structure 222 at a first end of the test line 202, and the test line 202 is coupled to the second feeder line 206 by a second no-flux via structure 224 at a second end of the test line 202. The first and second no-flux via structures 222 and 224 are comprised of tungsten according to one embodiment of the present invention. With such no-flux via structures 222 and 224, the material of the first and second feeder lines 204 and 206 does not move into the test line 202, and the material of the test line 202 does not move into the first and second feeder lines 204 and 206.

Figure 3:
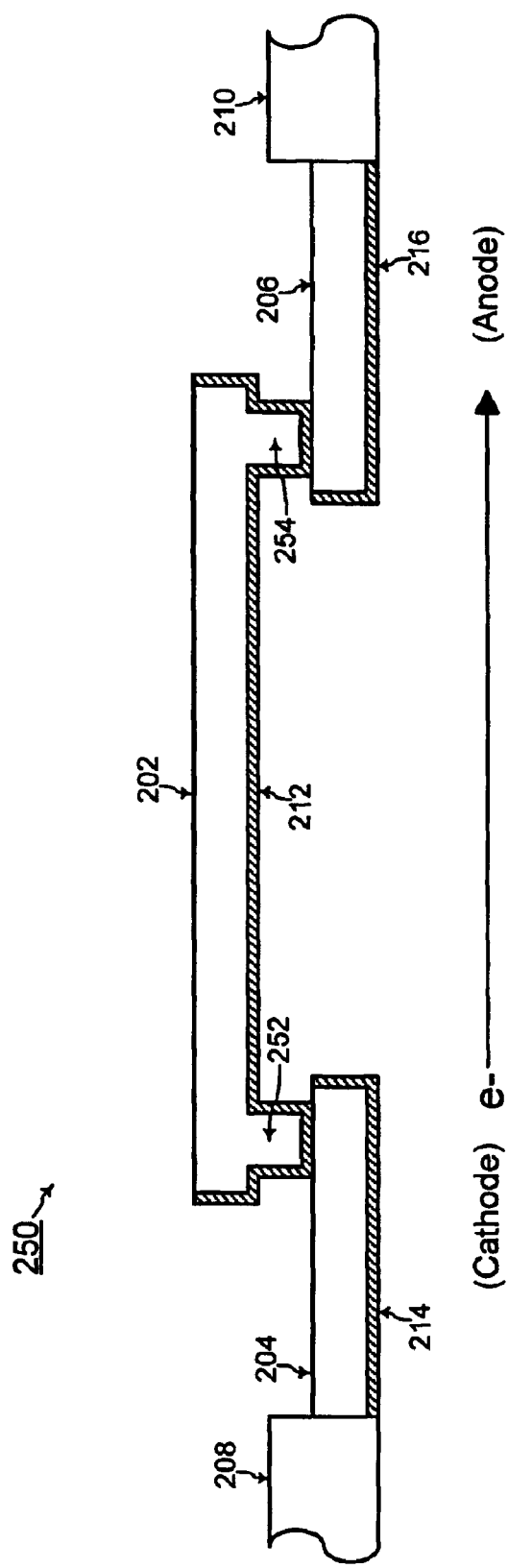
FIG. 3 shows a cross-sectional view of an interconnect test structure having no-flux dual damascene via structures, according to an embodiment of the present invention.

FIG. 3 shows the cross-sectional view of an interconnect test structure 250 according to another embodiment of the present invention. Elements having the same reference number in FIGS. 2 and 3 refer to elements having similar structure and function. However, the interconnect test structure 250 of FIG. 3 includes first and second no-flux via structures 252 and 254 that are part of the dual damascene structure of the test line 202 for coupling the test line 202 to the first and second feeder lines 204 and 206, respectively. When the test line 202 is comprised of copper, the diffusion barrier layer material 212 also surrounds the first and second no-flux via structures 252 and 254.

The diffusion barrier layer material 212 is substantially impermeable according to one embodiment of the present invention such that the first and second via structures 252 and 254 are no-flux structures. For example, the thickness of the diffusion barrier layer material 212 may be substantially large enough such that the diffusion barrier layer material 212 at the bottom of the first and second via structures 252 and 254 is substantially impermeable. With such no-flux via structures 252 and 254, the material of the first and second feeder lines 204 and 206 does not move into the test line 202, and the material of the test line 202 does not move into the first and second feeder lines 204 and 206.

In either case of FIG. 2 or 3, such no-flux via structures prevent void formation within the interconnect test structure 200 or 250 from flux of material from the first and second feeder lines 204 and 206 into the test line 202 or from the test line 202 into the first and second feeder lines 204 and 206. Thus, void formation during stress-migration testing is ensured to be formed from stress-migration and not from flux of material between the feeder lines 204 and 206 and the test line 202.

Figure 4:
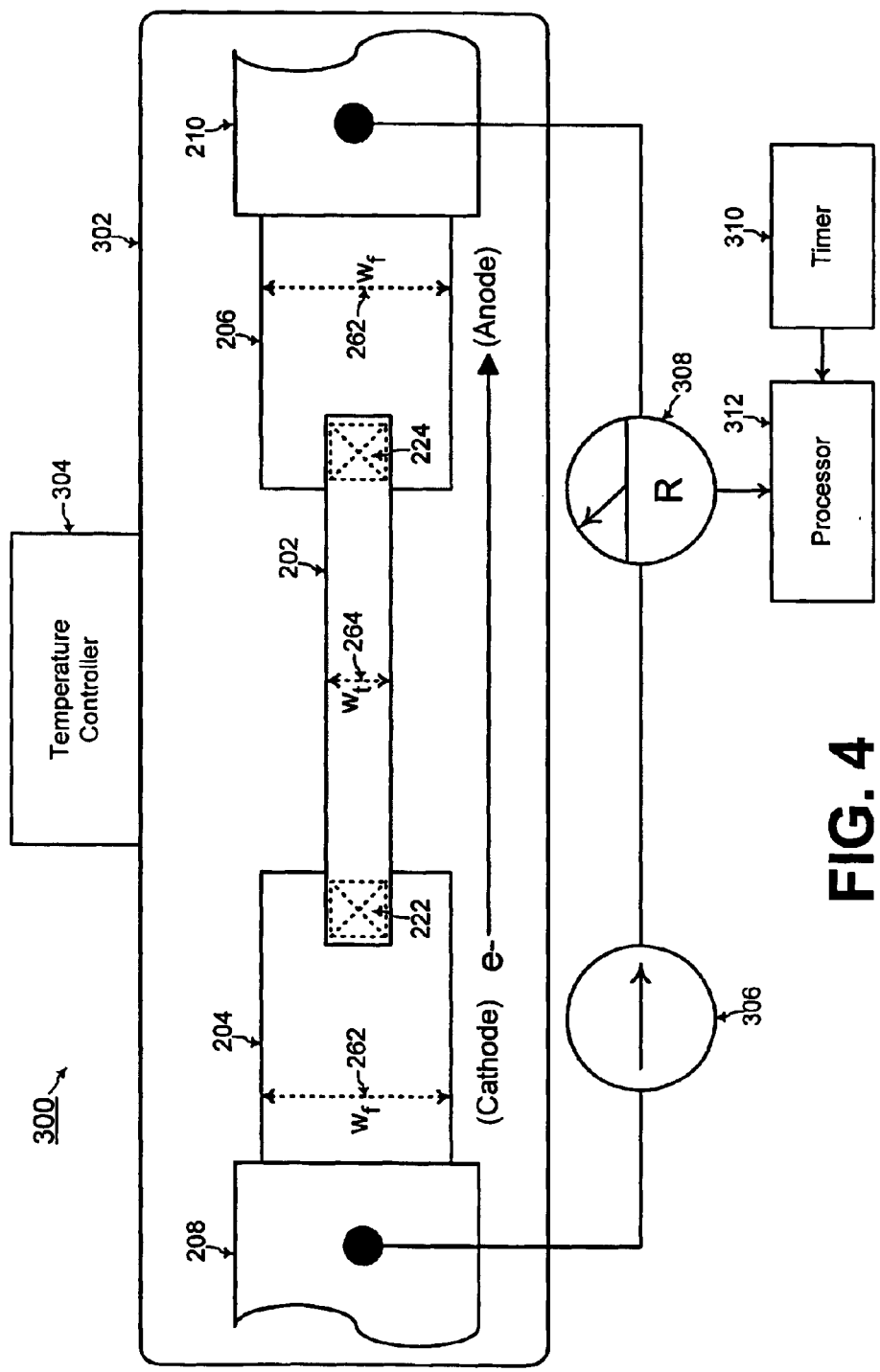
FIG. 4 shows a block diagram of a system of testing for stress-migration failure with the interconnect test structure of FIG. 2 or 3, according to an embodiment of the present invention.

FIG. 4 shows a block diagram of a system 300 for testing for stress-migration failure of the interconnect test structure 200 of FIG. 2 or 250 of FIG. 3. The top view of the interconnect test structure 200 of FIG. 2 is shown in FIG. 4 for example. In one embodiment of the present invention, the width ($w_f$) 262 of each of the first and second feeder lines 204 and 206 is substantially greater (such as at least ten times greater) than the width ($w_t$) 264 of the test line 202 for the interconnect test structure 200 of FIGS. 2 and 250 of FIG. 3. Such dimensions enhance void formation from stress-migration within the feeder lines 204 and 206 below the bottom of the via structures 222 and 224 in FIG. 2 or via structures 252 and 254 in FIG. 3.

Further referring to FIG. 4, the interconnect test structure including the test line 202, the feeder lines 204 and 206, and the test pads 208 and 210 is placed within a heating chamber 302. A temperature controller 304 controls the temperature within the heating chamber 302 to be maintained at a predetermined temperature. Such a heating chamber is individually known to one of ordinary skill in the art.

In addition, a current source 306 is coupled between the first and second test pads 208 and 210 for providing a current conducted through the second feeder line 206, the test line 202, and the first feeder line 204. A resistance meter 308 is also coupled between the first and second test pads 208 and 210 for measuring a resistance between the first and second test pads 208 and 210. Such a current source and resistance meter are each individually known to one of ordinary skill in the art.

Furthermore, the resistance meter 308 and a timer 310 are coupled to a data processor 312 that determines a stress-migration life-time of the interconnect test structure within the heating chamber 302. According to an embodiment of the present invention, the interconnect test structure is placed within the heating chamber 302 to be continuously heated to the predetermined temperature. In addition, a current from the current source 306 is continuously conducted through the second feeder line 206, the test line 202, and the first feeder line 204. The resistance meter 308 periodically measures the resistance across the interconnect test structure.

The data processor 312 determines that the interconnect test structure exhibits migration failure when the resistance measured by the resistance meter 308 exceeds a threshold resistance level. The data processor 312 also determines the stress-migration life-time of the interconnect test structure as the time measured by the timer 310 when the interconnect test structure exhibits migration failure. Such a data processor 312 and timer 310 are each individually known to one of ordinary skill in the art.

Figure 5:
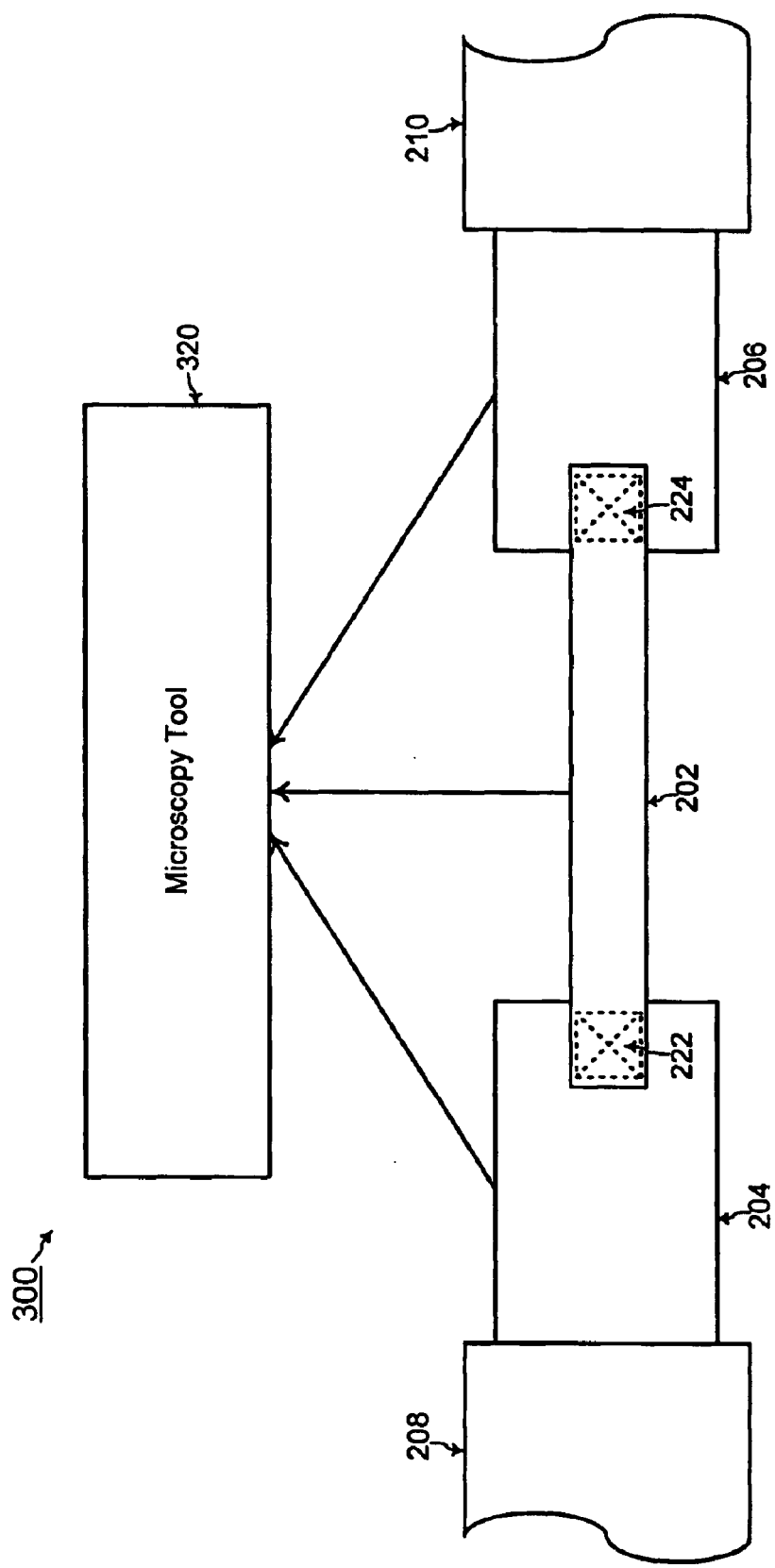
FIG. 5 illustrates use of a microscopy tool for determining a location of a void within the interconnect test structure of FIG. 2 or 3 after migration failure, according to an embodiment of the present invention.

Referring to FIG. 5, the system 300 according to an embodiment of the present invention further includes a microscopy tool 320 for determining a location of void formation within the interconnect test structure that exhibits migration failure. When the interconnect test structure is determined to exhibit migration failure, a cross-section along the length of the interconnect test structure (such as the cross-sectional view of FIG. 2 or 3 for example) is viewed with the microscopy tool 320 to determine a location of a void that causes such migration failure. Mechanisms for making such a cross-section along the length of the interconnect test structure and such a microscopy tool (for example the SEM (scanning electron microscope)) are individually known to one of ordinary skill in the art of integrated circuit fabrication.

Figure 6:
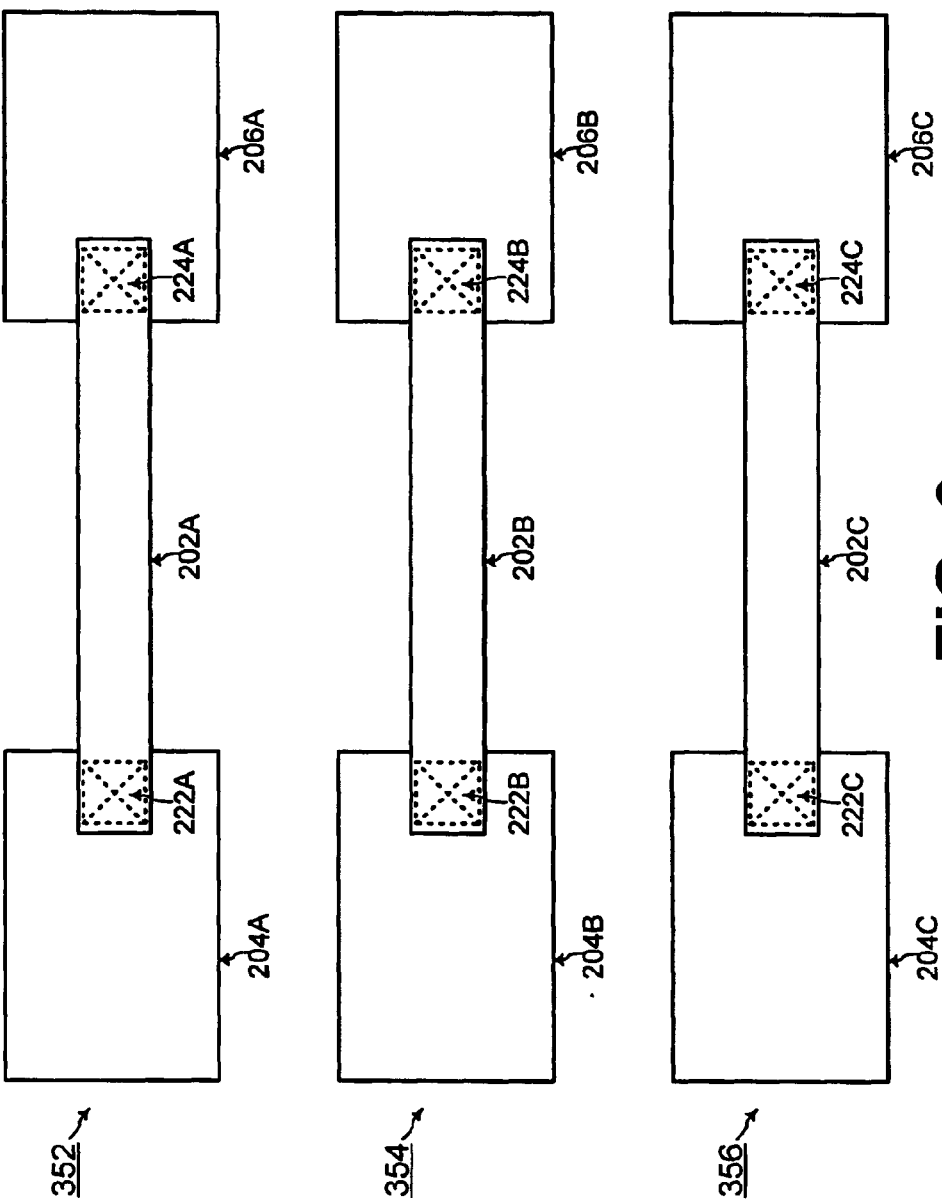
FIG. 6 shows a top view of a plurality of the interconnect test structure of FIG. 2 or 3 used for determining the critical current level when void formation leading to migration failure transitions from occurring within at least one feeder line to occurring within the test line, according to an embodiment of the present invention.

FIG. 6 shows a top view of a plurality of interconnect test structures including first, second, and third interconnect test structures, 352, 354, and 356, respectively, formed according to an embodiment of the present invention. Each of the first, second, and third interconnect test structures, 352, 354, and 356 has a respective test line 202A, 202B, and 202C, and has a respective first feeder line 204A, 204B, and 204C coupled to the respective test line by a respective first no-flux via structure 222A, 222B, and 222C. In addition, each of the first, second, and third interconnect test structures, 352, 354, and 356 has a respective second feeder line 206A, 206B, and 206C coupled to the respective test line by a respective second no-flux via structure 224A, 224B, and 224C.

The dimensions and the material comprising each of the first, second, and third interconnect test structures, 352, 354, and 356 are substantially the same, and the cross-section of each of the first, second, and third interconnect test structures, 352, 354, and 356 may be as illustrated in FIG. 2 or FIG. 3. Thus, the respective test line 202A, 202B, and 202C of each of the first, second, and third interconnect test structures, 352, 354, and 356 has a predetermined length and a predetermined cross-sectional area (i.e., the area going into the drawing page of FIG. 6).

Figure 7:
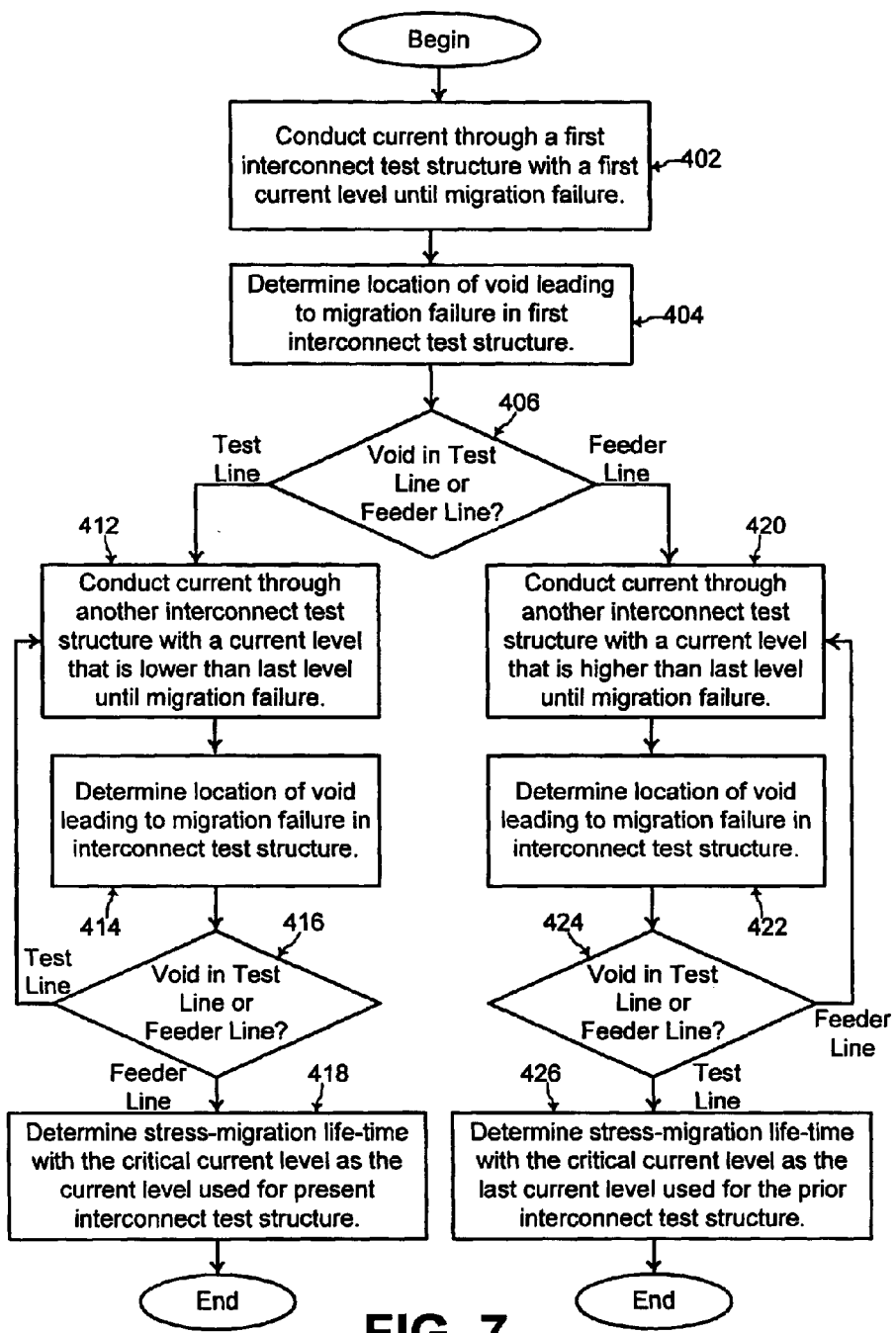
FIG. 7 shows a flow-chart of steps for using the plurality of the interconnect test structures of FIG. 6 for determining the critical current level when void formation leading to migration failure transitions from occurring within at least one feeder line to occurring within the test line, according to an embodiment of the present invention.

FIG. 7 shows a flow-chart of steps for using the plurality of interconnect test structures, 352, 354, and 356 and the system 300 of FIGS. 4 and 5 for stress-migration testing according to an embodiment of the present invention. Referring to FIGS. 4, 6, and 7, the first interconnect test structure 352 is placed within the heating chamber 302 to be continuously heated to a predetermined temperature in a range of from about 150° Celsius. to about 350° Celsius. for example (step 402 of FIG. 7). Furthermore, a first level of current from the current source 306 is continuously conducted through the first interconnect test structure 352 that is heated to the predetermined temperature within the heating chamber 302 until the first interconnect test structure 352 exhibits migration failure (step 402 of FIG. 7).

The microscopy tool 320 is then used to determine the location of the void causing the migration failure of the first interconnect test structure 352 (step 404 of FIG. 7). Referring to FIGS. 2, 7, and 8, a void 408 causing the migration failure may occur within at least one of the first and second feeder lines 204 and 206. In that case, the void 408 is formed from stress-migration caused by mechanical stress at the interface between one of the via structures 222 and 224 and the respective one of the feeder lines 204 and 206. Referring to FIG. 9, a void 409 from such stress-migration may also be formed within the second feeder line 206, and referring to FIG. 10, both voids 408 and 409 may be simultaneously formed within both of the first and second feeder lines 204 and 206.

Alternatively, a void 410 causing the migration failure may occur within the test line 202. In that case, the void 410 is formed from electromigration of material within the test line 202. Such electromigration failure of the test line 202 is more likely to occur before stress-migration void formation within the feeder lines 204 and 206 from an increase of the current level flowing through the interconnect test structure 200. For characterizing stress-migration failure through the interconnect test structure 200, a critical current level is desired to be determined. Void formation leading to migration failure of the interconnect test structure 200 transitions from occurring within at least one of the feeder lines 204 and 206 to occurring within the test line 202 when a current level greater than the critical current level is conducted through the interconnect test structure 200 (as illustrated by the void 408 within the first feeder line 204 to the void 410 within the test line 202 in FIG. 8).

Referring back to FIG. 7, if the location of the void leading to migration failure in the first interconnect test structure 352 is within the test line 202 (step 406 in FIG. 7), the second interconnect test structure 354 is placed within the heating chamber 302 to be continuously heated to the predetermined temperature (step 412 of FIG. 7). Furthermore, a second level of current from the current source 306 is continuously conducted through the second interconnect test structure 354 that is heated to the predetermined temperature within the heating chamber 302 until the second interconnect test structure 354 exhibits migration failure (step 412 of FIG. 7). The second level of current for the second interconnect test structure 354 is lower than the first level of current that was conducted through the first interconnect test structure 352 in step 402.

The microscopy tool 320 is then used to determine the location of the void causing the migration failure of the second interconnect test structure 354 (step 414 of FIG. 7). If the location of the void leading to migration failure in the second interconnect test structure 354 is still within the test line 202 (step 416 in FIG. 7), then steps 412, 414, and 416 are repeated with another interconnect test structure (such as the third interconnect test structure 356) that is heated to the predetermined temperature within the heating chamber 302 but with a lower level of current continuously flowing there-through than the prior level of current used for the prior interconnect test structure until void formation leading to migration failure transitions from occurring within the test line to one of the feeder lines (as illustrated by the void 410 within the test line 202 to the void 408 within the first feeder line 204 in FIG. 11).

In this manner, the plurality of the interconnect test structures 352, 354, and 356 of FIG. 6 are used for determining the critical current level. More numerous number of interconnect test structures may be used than the example of the three interconnect test structures 352, 354, and 356 of FIG. 6. However, three interconnect test structures 352, 354, and 356 are illustrated in FIG. 6 for clarity of illustration.

Figure 11:
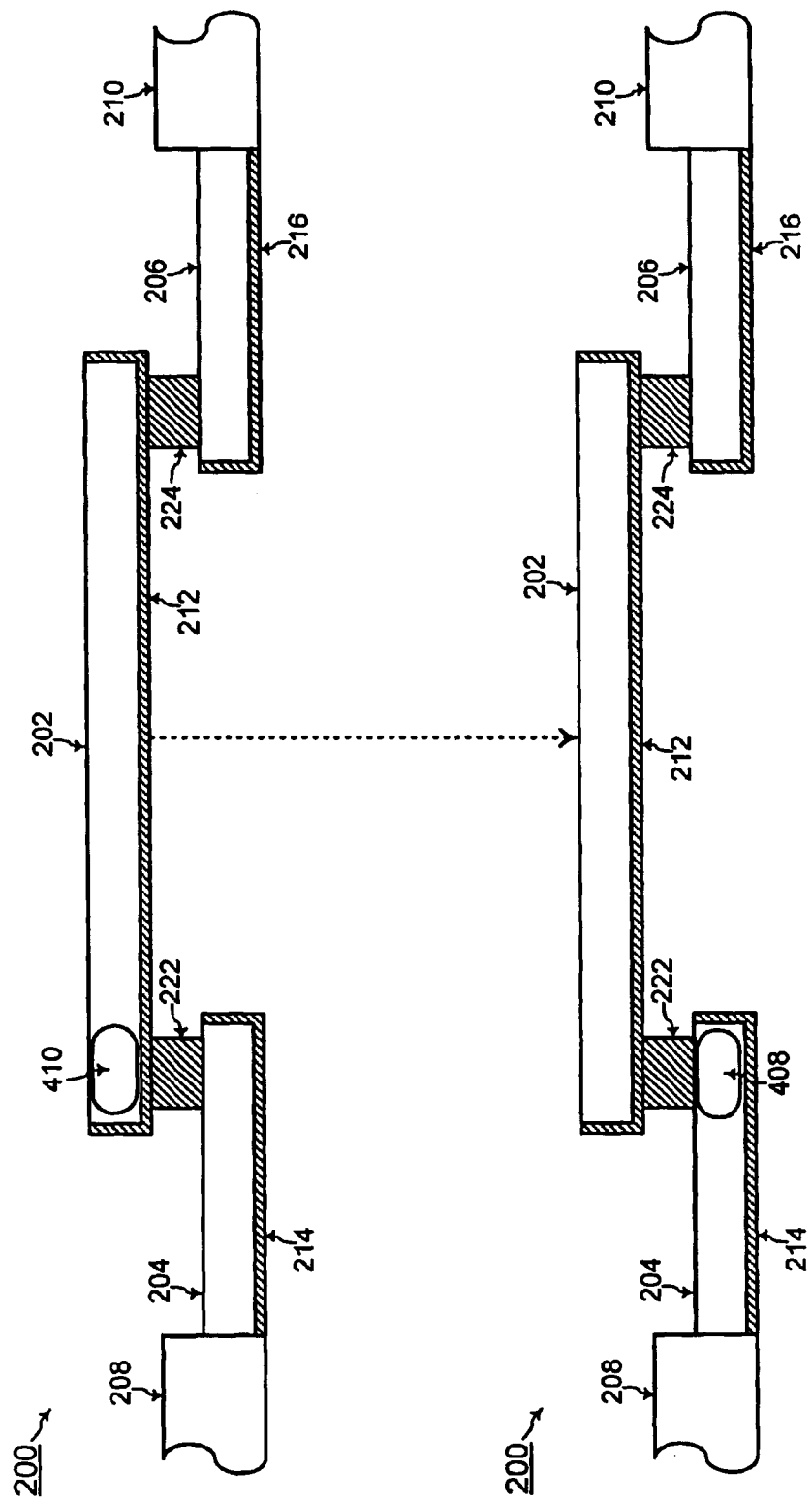
FIG. 11 shows a cross-sectional view of the interconnect test structure of FIG. 2 when void formation leading to migration failure transitions from occurring within the test line to occurring within at least one feeder line, according to an embodiment of the present invention.

Once void formation leading to migration failure transitions from occurring within the test line to one of the feeder lines (step 416), the critical current level is determined to be that current level that caused such a transition as illustrated in FIG. 11. Then, another one of the plurality of interconnect test structures of FIG. 6 is used for determining the stress-migration life-time (step 418 of FIG. 7). This new interconnect test structure is placed within the heating chamber 302 to be continuously heated to the predetermined temperature, and the critical current level from the current source 302 is continuously conducted through this interconnect test structure that is continuously heated to the predetermined temperature. The data processor 312 and the timer 310 then determine a stress-migration life-time when the resistance as measured by the resistance meter 308 exceeds a threshold resistance level while the critical current level is continuously conducted through this interconnect test structure that is continuously heated to the predetermined temperature.

Referring back to step 406 of FIG. 7, if the location of the void leading to migration failure in the first interconnect test structure 352 is within at least one of the feeder lines 204 and 206, the second interconnect test structure 354 is placed within the heating chamber 302 to be continuously heated to the predetermined temperature (step 420 of FIG. 7). Furthermore, a second level of current from the current source 306 is continuously conducted through the second interconnect test structure 354 that is heated to the predetermined temperature within the heating chamber 302 until the second interconnect test structure 354 exhibits migration failure (step 420 of FIG. 7). However, the second level of current for the second interconnect test structure 354 in this case is higher than the first level of current that was conducted through the first interconnect test structure 352 in step 402.

The microscopy tool 320 is then used to determine the location of the void causing the migration failure of the second interconnect test structure 354 (step 422 of FIG. 7). If the location of the void leading to migration failure in the second interconnect test structure 354 is still within at least one of the feeder lines 204 and 206 (step 424 in FIG. 7), then steps 420, 422, and 424 are repeated with another interconnect test structure (such as the third interconnect test structure 356) that is heated to the predetermined temperature within the heating chamber 302 but with a higher level of current continuously flowing there-through than the prior level of current used for the prior interconnect test structure until void formation leading to migration failure transitions from occurring within one of the feeder lines to the test line (as illustrated by the void 410 within the first feeder line 204 to the void 410 within the test line 202 in FIG. 8).

Once void formation leading to migration failure transitions from occurring within one of the feeder lines to within the test line (step 424 of FIG. 7)) the critical current level is determined to be the last current level used for the prior interconnect test structure placed within the heating chamber 302 with void formation located within one of the feeder lines. Then, another one of the plurality of interconnect test structures of FIG. 6 is used for determining the stress-migration life-time (step 426 of FIG. 7). This new interconnect test structure is placed within the heating chamber 302 to be continuously heated to the predetermined temperature, and the critical current level from the current source 302 is continuously conducted through this interconnect test structure. The data processor 312 and the timer 310 then determine a stress-migration lifetime when the resistance as measured by the resistance meter 308 exceeds a threshold resistance level while the critical current level is continuously conducted through this interconnect test structure that is continuously heated to the predetermined temperature.

In this manner, with the critical current level constantly flowing through the interconnect test structure that is continuously heated to the predetermined temperature, the interconnect test structure exhibits a shorter stress-migration life-time. A higher current level flowing through the interconnect test structure increases the rate of stress-migration failure of the interconnect test structure. The critical current level is the maximum possible current level flowing through the interconnect test structure before electromigration failure instead of stress-migration failure is exhibited by the interconnect test structure. Thus, the critical current level flowing through the interconnect test structure increases the rate of stress-migration failure of the interconnect test structure as much as possible for stress-migration detection.

In addition, the critical current level varies depending on the predetermined temperature within the heating chamber 302. The steps of the flow-chart of FIG. 7 may be repeated with another set of the plurality of interconnect test structures of FIG. 6 for determining the respective critical current level for each of a plurality of temperatures of the heating chamber 302.

The foregoing is by way of example only and is not intended to be limiting. Any specified material or any specified dimension of any structure described herein is by way of example only. For example, the present invention may be practiced with either of the interconnect test structure 200 of FIG. 2 or 250 of FIG. 3, as would be apparent to one of ordinary skill in the art from the description herein. In addition, the present invention may be practiced when the test line 202 and the feeder lines 204 and 206 of the interconnect test structure 200 of FIG. 2 or 250 of FIG. 3 are comprised of various types of conductive material and are comprised of same or different conductive materials from each-other, as would be apparent to one of ordinary skill in the art from the description herein.

Additionally, the present invention may be practiced when the interconnect test structures are formed differently than illustrated by way of example only in FIGS. 2 and 3. For example, referring to FIG. 12, an interconnect test structure 500 has the test line 202 and the first and second feeder lines 204 and 206 of the interconnect test structure 200 of FIG. 2. Elements having the same reference number in FIGS. 2 and 12 refer to elements having similar structure and function. However, the interconnect test structure 500 of FIG. 12 includes a third feeder line 502 surrounded by a diffusion barrier layer material 503, coupled to a third test pad 510, and coupled to the test line 202 at the first end by a third no-flux via structure 504 comprised of tungsten. In addition, the interconnect test structure 500 of FIG. 12 also includes a fourth feeder line 506 surrounded by a diffusion barrier layer material 507, coupled to a fourth test pad 512, and coupled to the test line 202 at the second end by a fourth no-flux via structure 504 comprised of tungsten.

Figure 12:
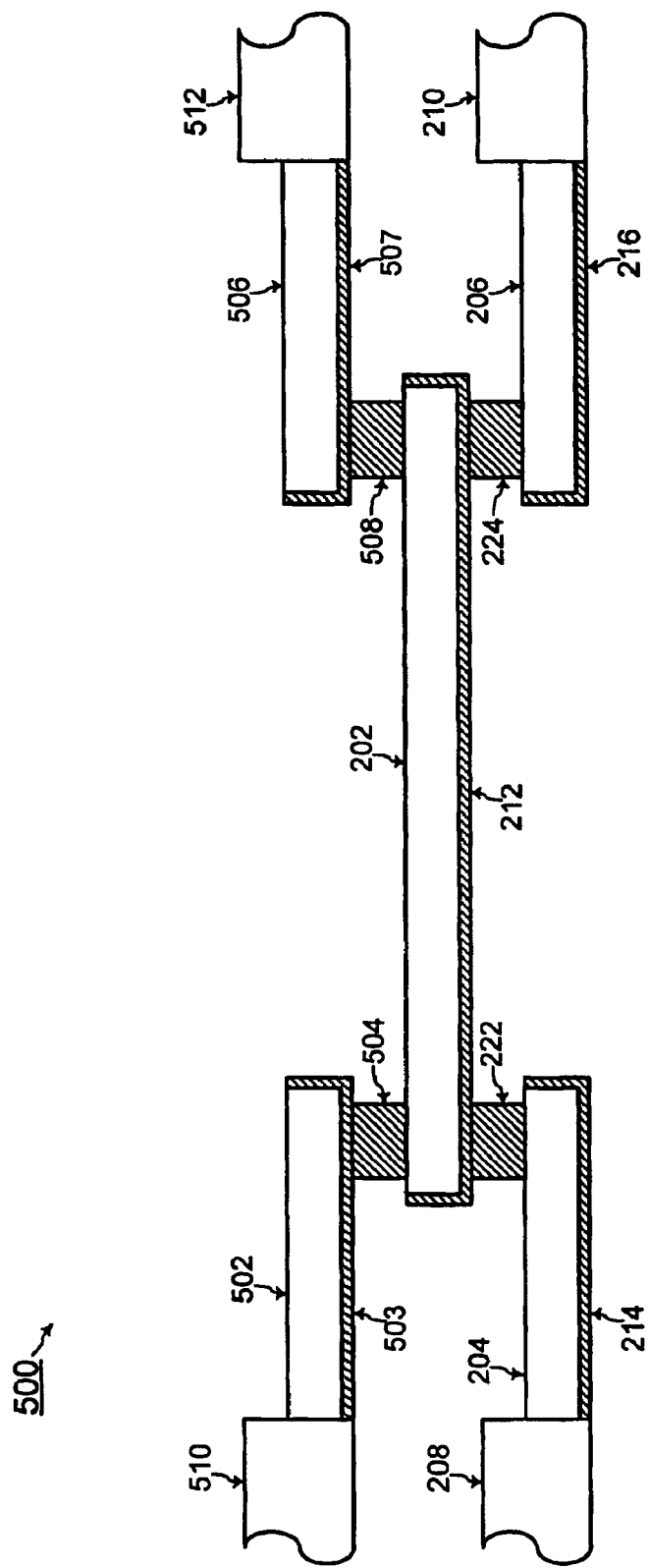
FIG. 12 shows a cross-sectional view of the interconnect test structure of FIG. 2 with additional feeder lines and additional no-flux via structures comprised of tungsten, according to an embodiment of the present invention.

The width of the third and fourth feeder lines 502 and 506 (i.e., the width going into the drawing page of FIG. 12) is substantially larger than the width of the test line 202 (i.e., the width going into the drawing page of FIG. 12). For the interconnect test structure 500 of FIG. 12, a void from stress-migration may be formed within any of the first, second, third, and fourth feeder lines 204, 206, 502, and 506. The critical current level would be determined when void formation leading to migration failure of such an interconnect test structure 500 transitions from occurring within at least one of the feeder lines 204, 206, 502, and 506 to within the test line 202.

In addition, as will be understood by those skilled in the art, the structures described herein may be made or used in the same way regardless of their position and orientation. Accordingly, it is to be understood that terms and phrases such as "on" as used herein refer to relative location and orientation of various portions of the structures with respect to one another, and are not intended to suggest that any particular absolute orientation with respect to external objects is necessary or required. Thus, the present invention may also be practiced when just the third and fourth feeder lines 502 and 506 with the no-flux via structures 504 and 508 are formed on the test line 202 at a higher interconnect level as illustrated in FIG. 13.

The present invention is limited only as defined in the following claims and equivalents thereof.

We claim:

1. A method of testing for stress-migration failure of an interconnect test structure having a first feeder line coupled to a test line by a first no-flux structure, and having a second feeder line coupled to the test line by a second no-flux structure, including the steps of:
   determining a critical current level when void formation leading to migration failure of the test structure transitions from occurring within at least one of the first and second feeder lines to occurring within the test line when a current level greater than the critical current level is continuously conducted through the interconnect test structure;
   conducting the critical current level through the interconnect test structure; and
   measuring a stress-migration lifetime of the interconnect test structure with the critical current level being continuously conducted through the interconnect test structure.

2. The method of claim 1, wherein a respective width of each of the first and second feeder lines is greater than a width of the test line.

3. The method of claim 2, wherein the width of each of the first and second feeder lines is at least ten times larger than the width of the test line.

4. The method of claim 1, further including the step of:
   forming a plurality of the interconnect test structures for determining the critical current level.

5. The method of claim 4, wherein the critical current level varies depending on a predetermined temperature of the interconnect test structure, and wherein a respective critical current level is determined when the interconnect test structure is heated to each of a plurality of temperatures.

6. The method of claim 1, wherein the first and second no-flux structures are each a via structure.

7. The method of claim 6, wherein the first and second no-flux structures are each comprised of tungsten.

8. The method of claim 6, wherein the first and second no-flux structures are each a via structure that is part of a dual damascene structure of the test line with an impermeable diffusion barrier layer material at the bottom of the via structure.

9. The method of claim 1, wherein the test line and the first and second feeder lines are comprised of copper surrounded by a diffusion barrier layer material.

10. A method of testing for stress-migration failure of interconnect, the method including the steps of:
   A. conducting a current through one of a plurality of interconnect test structures, with each interconnect test structure including:
      a test line having a predetermined length and a predetermined cross-sectional area;
      a first feeder line disposed toward a first end of the test line and being coupled to the test line by a first no-flux structure; and
      a second feeder line disposed toward a second end of the test line and being coupled to the test line by a second no-flux structure;
      wherein a respective width of each of the first and second feeder lines is greater than a width of the test line;
   B. heating the one of the plurality of interconnect test structures to a predetermined temperature;
   C. detecting for migration failure of the one of the plurality of interconnect test structures as the current is conducted through the one of the plurality of interconnect test structures that is heated to the predetermined temperature;
   D. determining a location of void formation after the one of the plurality of interconnect test structures exhibits migration failure;
   E. if the location of void formation within the one of the plurality of interconnect test structures is within at least one of the first and second feeder lines, repeating the steps A, B, C, and D with another one of the plurality of interconnect test structures but with a higher level of current conducted through the another one of the plurality of interconnect test structures;
   F. repeating the step E for each of another one of the plurality of interconnect test structures with a respective successively higher current level until the location of void formation transitions from occurring within at least one of the first and second feeder lines to within the test line;
   G. if the location of void formation within the one of the plurality of interconnect test structures is within the test line, repeating the steps A, B, C, and D with another one of the plurality of interconnect test structures but with a lower level of current conducted through the another one of the plurality of interconnect test structures;

H. repeating the step G for each of another one of the plurality of interconnect test structures with a respective successively lower current level until the location of void formation transitions from occurring within the test line to at least one of the first and second feeder lines;

I. determining a critical current level at which void formation leading to migration failure transitions from occurring within at least one of the first and second feeder lines to occurring within the test line when a current level greater than the critical current level is conducted through the interconnect test structure; and J. determining a stress-migration life-time of one of the plurality of interconnect test structures with the critical current level continuously being conducted through the interconnect test structure that is continuously heated to the predetermined temperature.

11. The method of claim 10, wherein each of the plurality of interconnect test structures further includes:

a third feeder line disposed toward the first end of the test line and being coupled to the test line by a third no-flux structure; and a fourth feeder line disposed toward the second end of the test line and being coupled to the test line by a fourth no-flux structure;

wherein a respective width of each of the third and fourth feeder lines is greater than the width of the test line;

and wherein the critical current level is determined when void formation leading to migration failure transitions from occurring within at least one of the first, second, third, and fourth feeder lines to occurring within the test line when a current level greater than the critical current level is conducted through the interconnect test structure.

12. The method of claim 10, wherein the first and second no-flux structures are each a via structure.

13. The method of claim 12, wherein the first and second no-flux structures are each comprised of tungsten.

14. The method of claim 12, wherein each of the first and second no-flux structures that is a via structure is part of a dual damascene structure of the test line with an impermeable diffusion barrier layer material at the bottom of the via structure.

15. The method of claim 10, wherein the critical current level varies depending on the predetermined temperature, and wherein the method further includes the step of:

determining a respective critical current level when the interconnect test structure is heated to each of a plurality of temperatures.

16. The method of claim 10, wherein the test line and the first and second feeder lines are comprised of copper surrounded by a diffusion barrier layer material.

* * * * *